United States Patent [19]

Fujii et al.

[11] Patent Number: 5,731,774
[45] Date of Patent: Mar. 24, 1998

[54] DIGITAL-TO-ANALOG CONVERTER

[75] Inventors: Kazuhito Fujii; Nobutaka Kitagawa, both of Kawasaki, Japan

[73] Assignee: Kabushiki Kaisha Toshiba, Kawasaki, Japan

[21] Appl. No.: 704,077

[22] Filed: Aug. 28, 1996

[30] Foreign Application Priority Data

Aug. 28, 1995 [JP] Japan ..................................... 7-219015

[51] Int. Cl.⁶ ..................................................... H03M 1/68
[52] U.S. Cl. .................................................. 341/144; 341/145
[58] Field of Search ................................... 341/144, 148, 341/150, 145, 154

[56] References Cited

U.S. PATENT DOCUMENTS 4,388,612  6/1983  Takagi ..................... 341/145
4,618,847  10/1986  Iida et al. ................. 341/145

OTHER PUBLICATIONS

T. Higuchi et al., "Analog-digital conversion," Nikkan Kogyo Shimbun Ltd. (Jun. 1995), pp. 18–19.
I. Takahashi, "Compact electronic circuit handbook," Maruzen Co. Ltd. (Jan. 1989), pp. 203–204.

*Primary Examiner*—Brian K. Young
*Attorney, Agent, or Firm*—Finnegan, Henderson, Farabow, Garrett & Dunner, L.L.P.

[57] ABSTRACT

A digital-to-analog converter includes a D/A converter circuit section, connection switching control circuit and multi-input operational amplifier circuit. The D/A converter circuit section is supplied with a binary code of upper i bits of an n-bit ($1 \leq i < n$) digital input, outputting a first voltage obtained by subjecting the i-bit binary code to the D/A conversion, and outputting a second voltage which is higher than the first voltage by an amount corresponding to the weight of the least significant bit of the i-bit input. The connection switching control circuit is supplied with the first and second voltages output from the D/A converter circuit section and a binary code of the remaining lower j ($1 \leq j < n$, j=n−i) bits of the above binary code. The connection switching control circuit decodes the j-bit binary code, selectively outputs the second voltage from the D/A converter circuit section to part of $2^j$ output nodes according to the result of decoding and selectively outputs the first voltage to the remaining part of the $2^j$ output nodes.

20 Claims, 10 Drawing Sheets

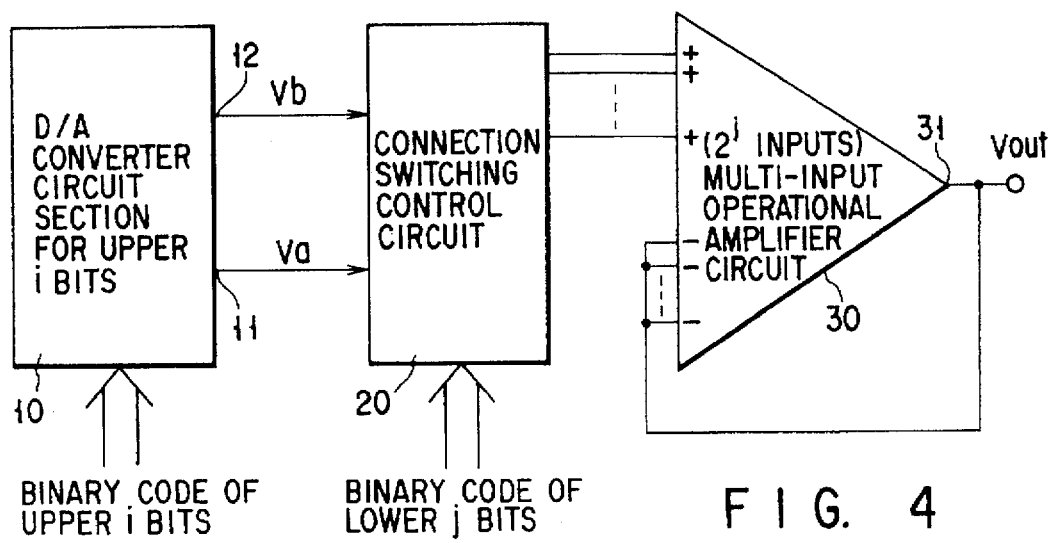
FIG. 4
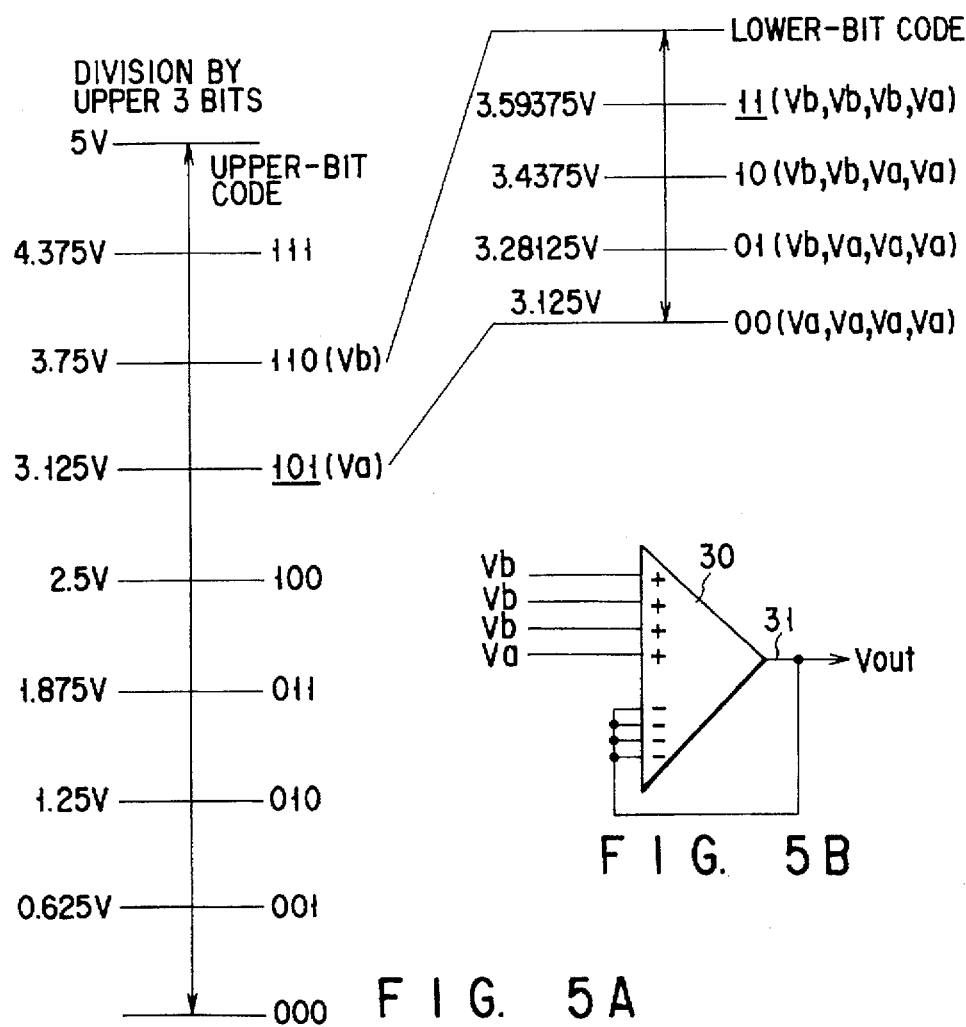
FIG. 5A
FIG. 5B

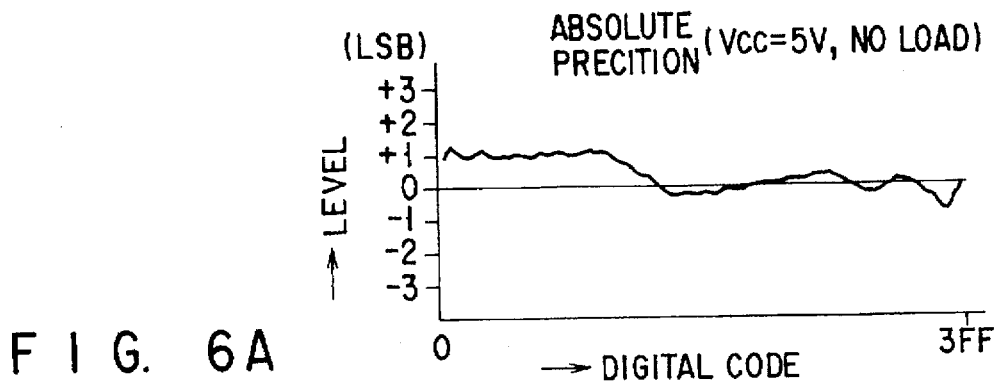
F I G. 6A
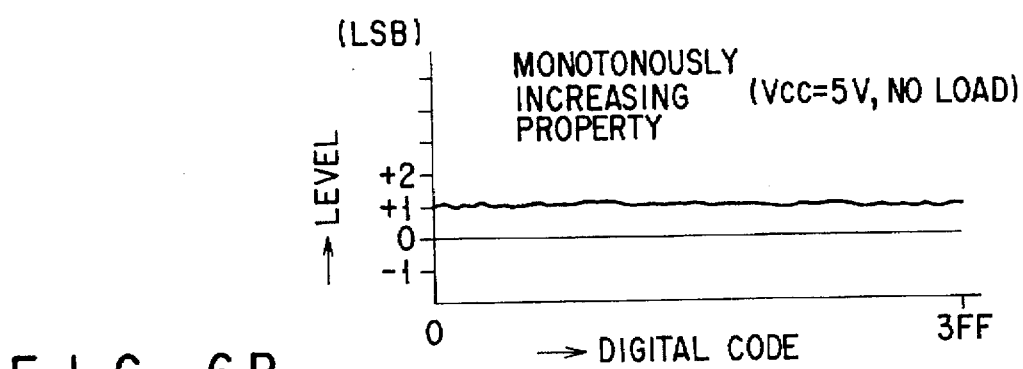
F I G. 6B
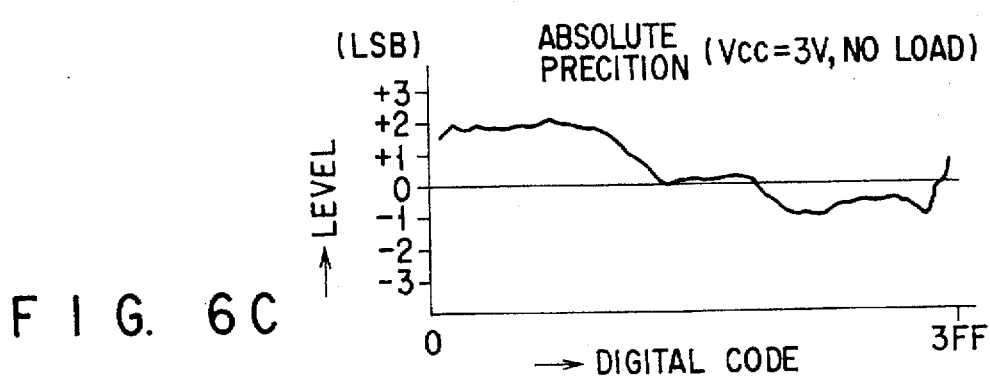
F I G. 6C
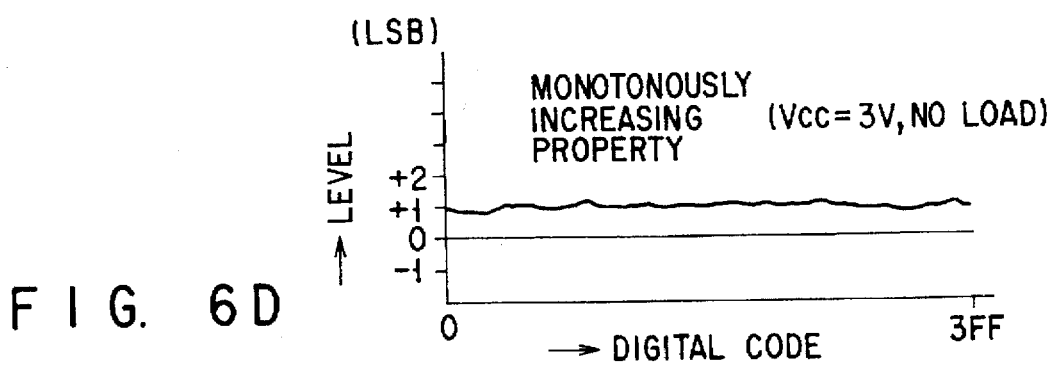
F I G. 6D

| 3-BIT BINARY CODE | POSITIVE INPUT TERMINALS (+) OF $2^3$-INPUT OPERATIONAL AMPLIFIER | | | | | | | |
|---|---|---|---|---|---|---|---|---|
| | No.1 | No.2 | No.3 | No.4 | No.5 | No.6 | No.7 | No.8 |
| 0 0 0 | Va | Va | Va | Va | Va | Va | Va | Va |
| 0 0 1 | Vb | Va | Va | Va | Va | Va | Va | Va |
| 0 1 0 | Vb | Vb | Va | Va | Va | Va | Va | Va |
| 0 1 1 | Vb | Vb | Vb | Va | Va | Va | Va | Va |
| 1 0 0 | Vb | Vb | Vb | Vb | Va | Va | Va | Va |
| 1 0 1 | Vb | Vb | Vb | Vb | Vb | Va | Va | Va |
| 1 1 0 | Vb | Vb | Vb | Vb | Vb | Vb | Va | Va |
| 1 1 1 | Vb | Vb | Vb | Vb | Vb | Vb | Vb | Va |

DIGITAL-TO-ANALOG CONVERTER

BACKGROUND OF THE INVENTION

1. Field of the Invention

This invention relates to an integrated digital-to-analog (D/A) converter, and more particularly to a D/A converter which has a D/A converter circuit section used for effecting the D/A conversion for an upper-bit section of a binary code of a digital input and a connection switching control circuit and a multi-input operational amplifier circuit used for effecting the D/A conversion for a lower-bit section thereof and which is used in a one-chip controller or one-chip microcomputer of CMOS structure (which are hereinafter referred to as microcomputers), for example.

2. Description of the Related Art

Generally, in a microcomputer, there is provided a D/A converter for converting a digital signal into a corresponding analog signal after the digital signal is variously processed in the internal portion thereof. The D/A converter contained in the microcomputer is required to have high precision of conversion, small pattern area (for low cost), high noise resistance and the like. In addition, in recent years, it is strongly desired to develop a D/A converter of multi-bit structure in which the number of bits to be converted is large.

As the performance of the D/A converter, the resolution, absolute precision, and monotonously increasing property are the main important three factors. The resolution of the D/A converter indicates the number of bits of a binary code used for representing an analog voltage to be output and corresponds to the minimum unit of a variation in the analog voltage. The resolution becomes higher as the number of bits of the binary code of the digital input becomes larger. The absolute precision of the D/A converter indicates an error of the actual value of a converted output with respect to an ideal value. The absolute precision is lowered by a change in the environment of application (a variation in the ambient temperature, fluctuation in the power source voltage and the like) and fluctuation in the manufacturing process (variations in the resistances of the resistors formed in the D/A converter or the like). The absolute precision is expressed by the following equation (1) when $V_{REFL}$ is 0 and is expressed by the following equation (2) when $V_{REFL}$ is not 0 if an analog output voltage obtained when a value of a digital input is i is set to V(i), the lower limit of the analog voltage value is set to $V_{REFL}$, the upper limit of the analog output voltage is set to $V_{REFH}$, and the number of bits of the digital input is set to n.

$$V(i) = (V_{REFH}/2^n) \times i \quad (1)$$

$$V(i) = [V_{REFL} + \{(V_{REFH} - V_{REFL})/2^n\} \times i] \quad (2)$$

Further, the monotonously increasing property of the D/A converter is a characteristic of an output analog voltage to linearly increase according to a variation in the binary code when the binary code of the digital input is sequentially increased and indicates the capability or possibility that the relation between the analog output voltage V(i) obtained when a value of the digital input is i and the analog output voltage V(i+1) obtained when a value of the digital input is (i+1) may satisfy the following expression (3) in the entire range of the digital input.

$$v(i) \leq v(i+1) \quad (3)$$

The most important factor among the three factors of the resolution, absolute precision and monotonously increasing property is determined according to the application of the D/A converter. For example, in a case where digital signals of multiple bits of RGB components used for display control are converted into corresponding analog signals which are in turn supplied to a color liquid crystal display driving circuit to display various colors on a color liquid crystal display device, the monotonously increasing property is the most important factor. This is because colors on the display image plane become gradually brighter when the values of the digital signals of the RGB components are gradually increased if the monotonously increasing property is excellent, but colors on the display image plane become temporarily dark if the monotonously increasing property is not obtained.

Conventionally, as the above-described D/A converter contained in the microcomputer, a R-2R ladder resistor type D/A converter and a string resistor type D/A converter are mainly used. The R-2R ladder resistor type D/A converter is described in the Nikkan Kogyo Shimbun Ltd., T. Higuchi et al., "Analog-digital conversion", June 1995, pp. 18 and 19, ISBN 4-526-03733-8, for example, and the string resistor type D/A converter is described in Maruzen Co. Ltd., I. Takahashi, "compact electronic circuit handbook", January 1989, pp. 203 and 204, ISBN 4-621-03331-X, for example.

Next, the R-2R ladder resistor type D/A converter and the string resistor type D/A converter are explained.

FIG. 1 shows an example of the construction of a 6-bit R-2R ladder resistor type D/A converter. An offset voltage and six bits $B_0$ to $B_5$ of a 6-bit binary code are respectively input to CMOS inverter circuits 80-1 to 80-7. The outputs of the CMOS inverter circuits 80-1 to 80-7 are respectively supplied to CMOS inverter circuits 81-1 to 81-7. The CMOS inverter circuits 81-1 to 81-7 are operated on the lower limit $V_{REFL}$ of the analog output voltage and the upper limit $V_{REFH}$ of the analog output voltage used as the power source voltages. Therefore, the "H" level of a signal output from each of the CMOS inverter circuits 81-1 to 81-7 is set to $V_{REFH}$ and the "L" level thereof is set to $V_{REFL}$. Outputs from the CMOS inverter circuits 81-1 to 81-7 are respectively supplied to one-side ends of resistors 82-1 to 82-7 each having a resistance of 2R. One end of a resistor 83-1 having a resistance of R is connected to the other ends of the resistors 82-1 and 82-2 and the other end thereof is connected to the other end of the resistor 82-3. A resistor 83-2 having a resistance of R is connected between the other end of the resistor 82-3 and the other end of the resistor 82-4. Likewise, resistors 83-3 to 83-5 each having a resistance of R are respectively connected between the other ends of the resistors 82-4 to 82-6 and the other ends of the resistors 82-5 to 82-7. An analog output voltage Vout is output from a connection node between the resistors 82-7 and 83-5.

Thus, the 6-bit R-2R ladder resistor type D/A converter is constructed by the CMOS inverter circuits 80-1 to 80-7, 81-1 to 81-7 and the resistors 82-1 to 82-7, 83-1 to 83-6. If the pattern areas of the CMOS inverter circuits 80-1 to 80-7, 81-1 to 81-7 are equal to each other and the pattern area of each of the resistors 82-1 to 82-7 having a resistance of 2R is twice the pattern area of each of the resistors 83-1 to 82-5 having a resistance of R, the CMOS inverter has a pattern occupancy area corresponding to 14 CMOS inverter circuits and a pattern occupancy area corresponding to 19 resistors of resistance R. If the digital input is increased by one bit, the total pattern occupancy area of the D/A converter is increased by a pattern area corresponding to two CMOS inverter circuits and a pattern area corresponding to three resistors of resistance R. Therefore, if the number of bits of the binary code of the digital input is n and the number of bits of the offset voltage is 1, a pattern occupancy area corresponding to $2(n+1)$ CMOS inverter circuits and a pattern occupancy area corresponding to $(n-1)+2(n+1)=3n+1$ resistors are required.

In order to maintain the preferable monotonously increasing property in the R-2R ladder resistor type D/A converter, it is necessary to strictly keep the ratio of the resistance of each of the resistors 83-1 to 83-5 to the resistance of each of the resistors 82-1 to 82-7 at 1:2. However, in practice, each of the resistors 83-1 to 83-5, 82-1 to 82-7 contains an error caused by a fluctuation in the manufacturing process. Further, on the resistors 82-1 to 82-7 side, since the ON-resistance of the MOS transistors in the CMOS inverter circuits 80-1 to 80-7, 81-1 to 81-7 are added to the resistances 2R, a variation in the ON-resistance also causes the error. The influence of the ON-resistance of the MOS transistor becomes stronger as the number of conversion bits becomes larger.

FIG. 2 shows the relation between the number n of bits of the binary code of the digital input and an error of the resistance 2R of the resistors 82-1 to 82-7 in a range in which the monotonously increasing property can be maintained in the R-2R ladder resistor type D/A converter. As is clearly seen from the diagram, it is necessary to reduce the relative errors of the resistances R and 2R as the number of bits of the binary code of the digital input becomes larger and, for example, when the number n of bits becomes approximately 10, the monotonously increasing property cannot be maintained if the relative errors of the resistances R and 2R are not set within a range of approx. 0.2% for each bit of the binary code of the digital input. Further, since the ON-resistance of the MOS transistor in the CMOS inverter circuit associated with the error of the resistance 2R varies according to the condition of application (ambient temperature, power source voltage and the like) of the microcomputer, it becomes more difficult to realize the multiple bit structure larger than 10 bits by use of the R-2R ladder resistor type D/A converter. If a plurality of MOS transistors having current paths connected in parallel are used as the load MOS transistors and drive MOS transistors of the CMOS inverter circuits 80-1 to 80-7, 81-1 to 81-7 in order to lower the ON-resistance of the MOS transistor causing the error, the influence by a variation in the ON-resistance can be suppressed. However, with the above construction, the pattern area of each of the CMOS inverter circuits 80-1 to 80-7, 81-1 to 81-7 becomes larger to increase the pattern occupancy area of the D/A converter.

FIG. 3 shows an example of the construction of a 10-bit string resistor type D/A converter. Binary code bits $B_0$ to $B_9$ of a 10-bit digital input and respective inversion signals $\overline{B}_0$ to $\overline{B}_9$ thereof are input to a decoder circuit 100. The decoder circuit 100 includes 10-input NAND gates 100-1 to 100-1024 and the NAND gates 100-1 to 100-1024 are selectively supplied with the binary code bits $B_0$ to $B_9$ and the inversion signals $\overline{B}_0$ to $\overline{B}_9$. For example, the NAND gate 100-1 is supplied with the binary code bits $B_0$ to $B_9$, the NAND gate 100-2 is supplied with the binary code bits $\overline{B}_9$, $B_1$ to $B_9$. Further, the NAND gate 100-1024 is supplied with the binary code bits $\overline{B}_0$ to $\overline{B}_9$. Output signals of the NAND gates 100-1 to 100-1024 are respectively supplied to CMOS inverter circuits 101-1 to 101-1024. 1024 resistors 103-1 to 103-1024 having a resistance of Rstr are serially connected between a first node to which an upper limit $V_{REFH}$ of an analog output voltage is applied and a second node to which a lower limit $V_{REFL}$ of the analog output voltage is applied so as to form a resistor string. One-side ends of transfer gates 102-1 to 102-1024 of CMOS structure are respectively connected to one-side ends of the resistors 103-1 to 103-1024 and the other ends thereof are connected together. The gates of the P-channel MOS transistors of the transfer gates 102-1 to 102-1024 are respectively connected to the output terminals of the NAND gates 100-1 to 100-1024, and the gates of the N-channel MOS transistors are respectively connected to the output terminals of the CMOS inverter circuits 101-1 to 101-1024. An analog voltage Vout is derived from the common connection node of the other ends of the transfer gates 102-1 to 102-1024.

The string resistor type D/A converter has a feature that the conversion precision is higher and the monotonously increasing property is excellent in comparison with the R-2R ladder type D/A converter.

Next, the pattern occupancy area of the string resistor type D/A converter is briefly explained. If the transfer gates 102-1 to 102-1024 have the same pattern areas as the CMOS inverter circuits 101-1 to 101-1024 and the NAND gates 100-1 to 100-1024 have the pattern areas which are ten times the pattern areas of the CMOS inverter circuits 101-1 to 101-1024, the 10-bit string resistor type D/A converter requires a pattern occupancy area of $(10+2) \times 2^{10} = 12288$ CMOS inverter circuits and a pattern occupancy area of $2^{10} = 1024$ resistors. In the case of the 11-bit string resistor type D/A converter, a pattern occupancy area of $(11+2) \times 2^{11} = 26624$ CMOS inverter circuits and a pattern occupancy area of 2048 resistors are required. Thus, each time the number of bits of the binary code of the digital input is increased by one, the pattern occupancy area of the CMOS inverter circuits and the pattern occupancy area of the resistors are doubled or more. Therefore, if the number of bits of the binary code of the digital input is n, a pattern occupancy area of $(n+2) \times 2^n$ CMOS inverter circuits and a pattern occupancy area of $2^n$ resistors having a resistance of Rstr are required.

Thus, in the string resistor type D/A converter, the number of components used is significantly increased if the number of bits of the digital input is large and the number of wirings is increased accordingly, and as a result, the pattern occupancy area is extremely enlarged. In addition, the conversion error increases with a variation in the resistance associated with the wirings.

As described above, in a D/A converter having a small number of conversion bits, both of the R-2R ladder resistor type and the string resistor type are effective. In the R-2R ladder resistor type D/A converter, the monotonously increasing property thereof is not so good as that of the string resistor type, but the pattern occupancy area is small and the rate of an increase in the pattern occupancy area with an increase in the number of conversion bits is small in comparison with the case of the string resistor type. On the other hand, in the string resistor type D/A converter, the pattern occupancy area thereof is larger than that of the R-2R ladder resistor type, but the monotonously increasing property is excellent and the conversion precision is high. However, if an attempt is made to construct a D/A converter having a large number of conversion bits, it is difficult to realize a high performance by use of either type and the pattern occupancy area is increased.

SUMMARY OF THE INVENTION

Accordingly, an object of this invention is to provide a D/A converter capable of effecting the D/A conversion with high precision in a relatively small pattern occupancy area even when the number of conversion bits is large.

The above object can be attained by a D/A converter comprising a D/A converter circuit section for receiving a partial binary code of upper bits of a digital input, outputting a first voltage obtained by subjecting the partial binary code of upper bits to the D/A conversion from a first output node, and outputting a second voltage which is higher than the D/A conversion voltage from a second output node; a connection switching control circuit for receiving the first and second voltages output from the D/A converter circuit section and a partial binary code containing lower bits of the digital input, decoding the partial binary code containing lower bits, selectively outputting the first voltage supplied from the D/A converter circuit section to part of a plurality of output nodes according to the result of decoding and selectively outputting the second voltage supplied from the D/A converter circuit section to the remaining part of the plurality of output nodes; and a multi-input operational amplifier circuit having a plurality of positive input terminals corresponding to the plurality of output nodes of the connection switching control circuit, negative input terminals of the same number as the plurality of positive input terminals, and an output terminal for outputting an analog voltage corresponding to the digital input, the plurality of positive input terminals being supplied with output voltages from the plurality of output nodes of the connection switching control circuit and the negative input terminals being commonly connected to the output terminal.

With the above construction, since the D/A conversion for part of the binary code of the digital input is effected by use of the D/A converter circuit section and the D/A conversion for the partial binary code containing the lower bits is effected by use of the connection switching control circuit and multi-input operational amplifier circuit, the number of conversion bits dealt with by the D/A converter circuit section can be reduced and a lowering in the precision of conversion and an increase in the pattern occupancy area can be suppressed. Therefore, when an attempt is made to form a D/A converter dealing with a large number of conversion bits, the allowable value of the error of the resistance can be made larger and higher precision can be attained with the same error in comparison with a case wherein the D/A converter is constructed only by a single ladder resistor type D/A converter. Further, the pattern occupancy area can be reduced in comparison with a case wherein the D/A converter is constructed only by a single string resistor type D/A converter. By using a string resistor type D/A converter as the above D/A converter circuit section, a D/A converter which is high in precision and excellent in the monotonously increasing property can be easily realized in a small pattern occupancy area.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a block diagram showing the schematic construction of a D/A converter according to a first embodiment of this invention;

FIG. 5A is a diagram showing the relation between the upper bits of an n-bit digital input and voltages of the first and second output nodes of the D/A converter circuit section and the relation between the lower bits and a voltage of the output node of a connection switching control circuit, for explaining the operation of the D/A converter shown in FIG. 4;

FIG. 5B is a circuit diagram showing a multi-input operational amplifier circuit having $2^j$ positive input terminals (+) supplied with voltages, for explaining the operation of the D/A converter shown in FIG. 4;

FIGS. 6A to 6D are characteristic diagrams showing examples of the absolute precision characteristics and monotonously increasing properties evaluated when a 10-bit D/A converter is realized by use of the circuit shown in FIG. 4;

DETAILED DESCRIPTION OF THE PREFERRED EMBODIMENTS

Figure 1:
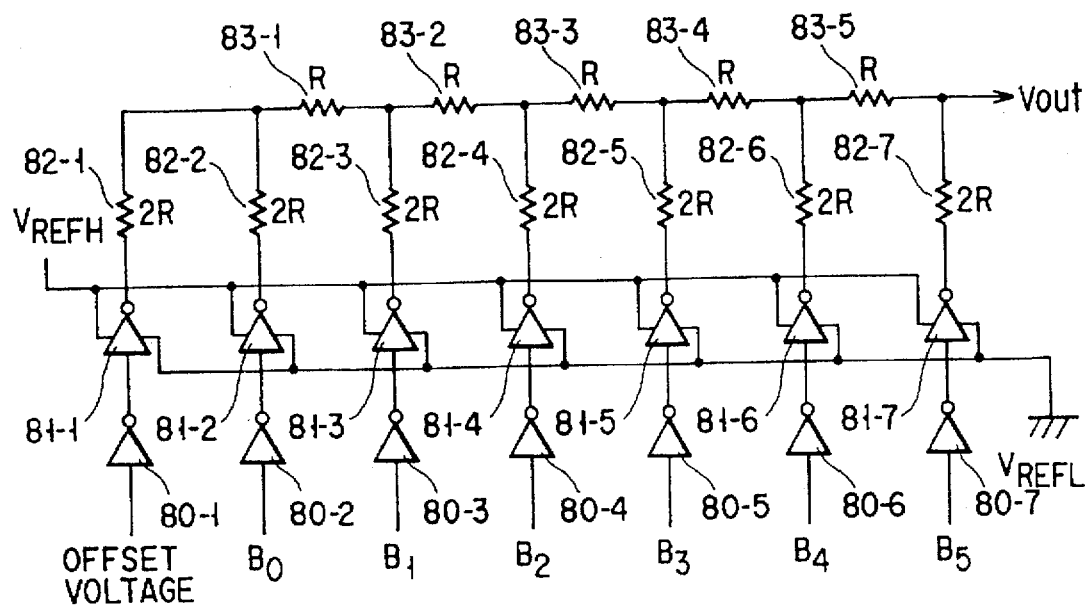
FIG. 1 is a circuit diagram showing a 6-bit R-2R ladder resistor type D/A converter, for explaining a conventional D/A converter.
Figure 2:
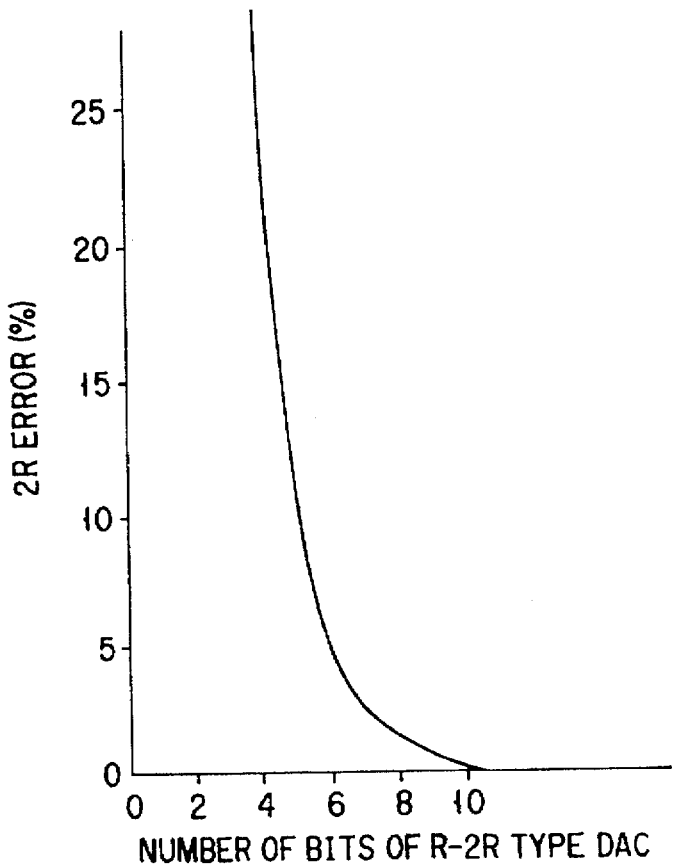
FIG. 2 is a diagram showing the relation between the number of bits of the binary code of the digital input and an error of the resistance 2R of the resistors in a range in which the monotonously increasing property of an analog output voltage can be maintained in an R-2R ladder resistor type D/A converter.

FIG. 4 is a block diagram showing the schematic construction of a D/A converter according to a first embodiment of this invention. The D/A converter is used for subjecting an n-bit binary code to the D/A conversion and creating an analog voltage Vout, and includes a D/A converter circuit section 10, a connection switching control circuit 20, and a multi-input operational amplifier circuit 30.

The D/A converter circuit section 10 is supplied with upper i bits ($1 \leq i < n$) of the n-bit binary code, outputs a D/A conversion voltage Va corresponding to the i-bit binary code from a first output node 11, and outputs a voltage Vb which is higher than the D/A conversion voltage Va by an amount corresponding to the weight of the least significant bit of the i-bit input from a second output node 12.

The connection switching control circuit 20 is supplied with the voltage Vb output from the second output node 12 of the D/A converter circuit section 10, the voltage Va output from the first output node 11 and the remaining lower j bits ($1 \leq j < n$, $j = n-1$) of the n-bit binary code and decodes the j-bit binary code. Then, the voltage Vb output from the second output node 12 of the D/A converter circuit section 10 is selectively output to part of the $2^j$ output nodes corresponding to the result of decoding and the voltage Va output from the first output node 11 of the D/A converter circuit section 10 is selectively output to the remaining ones of the $2^j$ output nodes. The connection switching control circuit 20 includes a decoder circuit for decoding the j-bit binary code and a plurality of analog switching circuits controlled by the decoder output of the decoder circuit so as to select the voltage Vb of the second output node 12 or the voltage Va of the first node 11 of the D/A converter circuit section 10 and output the selected voltage from the $2^j$ output nodes, for example.

The multi-input operational amplifier circuit 30 has $2^j$ positive input terminals (+) corresponding to the $2^j$ output nodes of the connection switching control circuit 20, $2^j$ negative input terminals (−) and an output terminal 31 for outputting an analog voltage Vout. The $2^j$ positive input terminals (+) are respectively supplied with voltages of the $2^j$ output nodes of the connection switching control circuit 20 and the $2^j$ negative input terminals (−) are commonly connected to the output terminal 31 (connected in a voltage follower configuration).

In the D/A converter with the above construction, the voltage level of the D/A conversion voltage Va of the first node 11 of the D/A converter circuit section 10 is determined according to the i-bit binary code, the voltage Vb of the second node 12 is always kept at a higher level than the D/A conversion voltage Va of the first output node 11, and the potential difference therebetween is set to a value corresponding to the weight of the least significant bit of the i-bit binary code. That is, one of potential differences determined by equally dividing the power source voltage Vcc of the D/A converter circuit section 10 is specified according to the i-bit binary code and produced between the first and second output nodes 11 and 12. Then, the multi-input operational amplifier circuit 30 outputs a voltage which is one of the voltages determined by equally dividing the voltage difference between the voltage Va of the first output node 11 and the voltage Vb of the second node 12 of the D/A converter circuit section 10 by $2^j$ and which corresponds to the input voltage to the $2^j$ positive input terminals (+) as the analog voltage Vout.

FIG. 5A shows the relation between voltages in a case where n=5, i=3, j=2, the power source voltage Vcc of the D/A converter circuit section 10 is 5 V, and the binary code of the digital input is (10111), for explaining the operation of the D/A converter shown in FIG. 4. The D/A converter circuit section 10 determines the voltage Va of the first output node 11 and the voltage Vb of the second node 12 according to the upper 3-bit binary code of (101). That is, a voltage of 3.75 V corresponding to the upper 3 bits (101) is selected from voltages determined by dividing 5 V by 8 as the voltage Vb and a voltage of 3.125 V is selected as the voltage Va. Further, voltages of the $2^j$ output nodes of the connection switching control circuit 20, that is, voltages input to the $2^j$ positive input terminals (+) of the multi-input operational amplifier circuit 30 are determined according to the lower 2 bits (11), and voltages Vb, Vb, Vb, Va are input to the positive input terminals (+) of the multi-input operational amplifier circuit 30 as shown in FIG. 5B. As a result, an analog voltage Vout corresponding to the digital input code (10111) is output from the multi-input operational amplifier circuit 30. That is, in the D/A converter shown in FIG. 4, the D/A conversion for the upper i bits of the binary code of the n-bit digital input is effected by the D/A converter circuit section 10 and the D/A conversion for the lower j bits is effected by the connection switching control circuit 20 and multi-input operational amplifier circuit 30, and analog voltage Vout corresponding to the n-bit binary code can be derived from the output terminal 31 of the multi-input operational amplifier circuit 30.

Therefore, with the above construction, since the D/A converter circuit section 10 can be formed with an i-bit input structure which is smaller in the conversion bit number than the n-bit input structure, a lowering in the precision of conversion and an increase in the pattern occupancy area can be suppressed even when the conversion bit number is increased. As the D/A converter circuit section, either an R-2R ladder resistor type or string resistor type can be used and another type can be used. If the R-2R ladder resistor type D/A converter circuit section is used, it can be realized in a small pattern occupancy area, and if the same number of input bits are used, the allowable value of the error of the resistance can be made larger and higher precision can be attained with the same error in comparison with a case wherein the D/A converter is constructed only by a single R-2R ladder resistor type D/A converter. If the error is set to the same value, the precision can be enhanced. Further, if a string resistor type D/A converter circuit section is used, a D/A converter which is high in precision and excellent in the monotonously increasing property can be realized in a small pattern area. However, the D/A conversion for the lower j bits is controlled by the precision of the multi-input operational amplifier circuit 30 having the $2^j$ inputs.

FIGS. 6A to 6D show the absolute precision characteristics and monotonously increasing properties of the analog output voltage evaluated in the no-load condition when the power source voltage Vcc is 5 V and 3 V in a case where the D/A converter shown in FIG. 4 is expanded to have a 10-bit input structure. FIG. 6A shows the absolute precision characteristic in the no-load condition when the power source voltage Vcc is 5 V, FIG. 6B shows the monotonously increasing property in the no-load condition when the power source voltage Vcc is 5 V, FIG. 6C shows the absolute precision characteristic in the no-load condition when the power source voltage Vcc is 3 V, and FIG. 6D shows the monotonously increasing property in the no-load condition when the power source voltage Vcc is 3 V. It is understood from the above characteristic diagrams that the absolute precision varies slightly but the monotonously increasing property is stable at approx. 1 LSB.

Next, the pattern occupancy area necessary for forming the D/A converter shown in FIG. 4 is studied. In order to realize a string resistor type D/A converter for i bits, it is necessary to use a resistor string having $2^i$ resistors of the same resistance connected between two nodes, $2^i$ analog switching circuits for selectively deriving voltages on the respective voltage dividing nodes of the resistor string and both end nodes thereof, and an i-bit decoder circuit (corresponding to $i \times 2^i$ inverter circuits) for decoding an i-bit digital signal input and controlling the analog switching circuits based on the decoding output. Further, for the connection switching control circuit 30 for j bits shown in FIG. 4, it is necessary to use a decoder circuit for j bits (corresponding to $j \times 2^j$ inverter circuits) and $2^j$ analog switching circuits. As a result, for the whole D/A converter for n (=i+j) bits shown in FIG. 4, it is necessary to use $2^i$ resistors, ($i \times 2^i + j \times 2^j$) inverter circuits, ($2^i + 2^j$) analog switching circuits and an operational amplifier circuit for $2^j$ inputs. Therefore, for example, in a case where n=10, i=7 and j=3, it is necessary to use a pattern occupancy area for 128 ($=2^7$) resistors, 920 ($=7 \times 2^7 + 3 \times 2^3$) inverter circuits, 1024 ($=2^7+2^3$) analog switching circuits, and an 8-input ($=2^3$-input) operational amplifier circuit.

On the other hand, if a conventional n-bit string resistor type D/A converter is realized, it is necessary to use $2^n$ resistors, $n \times 2^n$ inverter circuits, $2^n$ analog switching circuits and an operational amplifier circuit for buffer which is generally connected to the final stage to lower the output impedance. Therefore, in the case of n=10, it is necessary to use a pattern occupancy area for 1024 ($=2^{10}$) resistors, 10240 ($=10 \times 2^{10}$) inverter circuits, 1024 ($=2^{10}$) analog switching circuits, and an operational amplifier circuit for buffer.

That is, the n-bit D/A converter of the first embodiment can be formed in a pattern area which is approx. 1/10 times the pattern area required for the conventional n-bit string resistor type D/A converter if the operational amplifier circuit is not taken into consideration. In other words, as the D/A converter shown in FIG. 4, it becomes possible to realize the n-bit (=(i+j)-bit) D/A converter in a small pattern area by combining the string resistor type D/A converter circuit section 10 for the upper i bits, the connection switching control circuit 20 for the lower j bits, and the $2^j$-input multi-input operational amplifier circuit 30.

Figure 7:
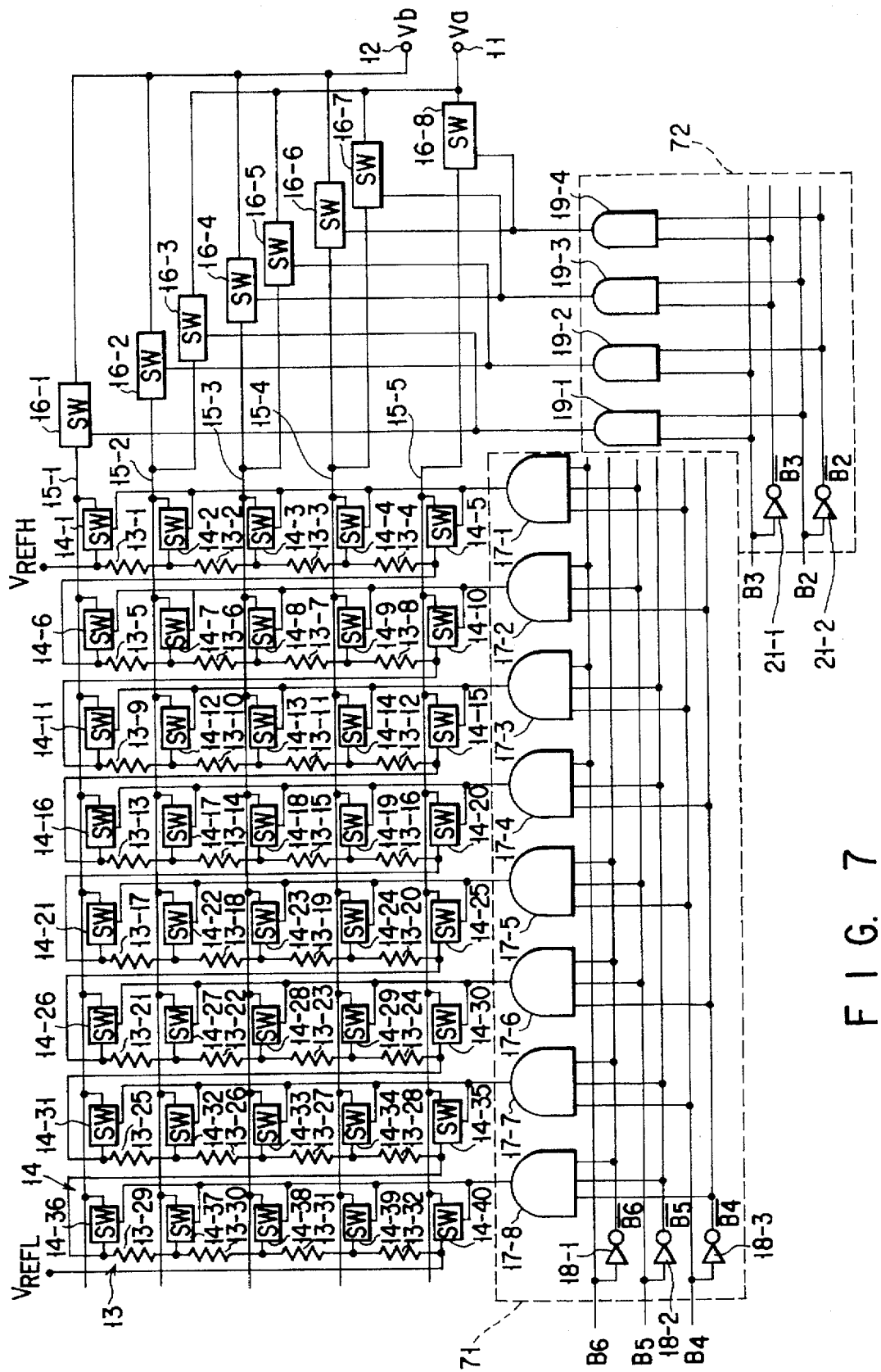
FIG. 7 is a circuit diagram showing an example of the detail construction of a D/A converter circuit section in the circuit shown in FIG. 4.
Figure 8:
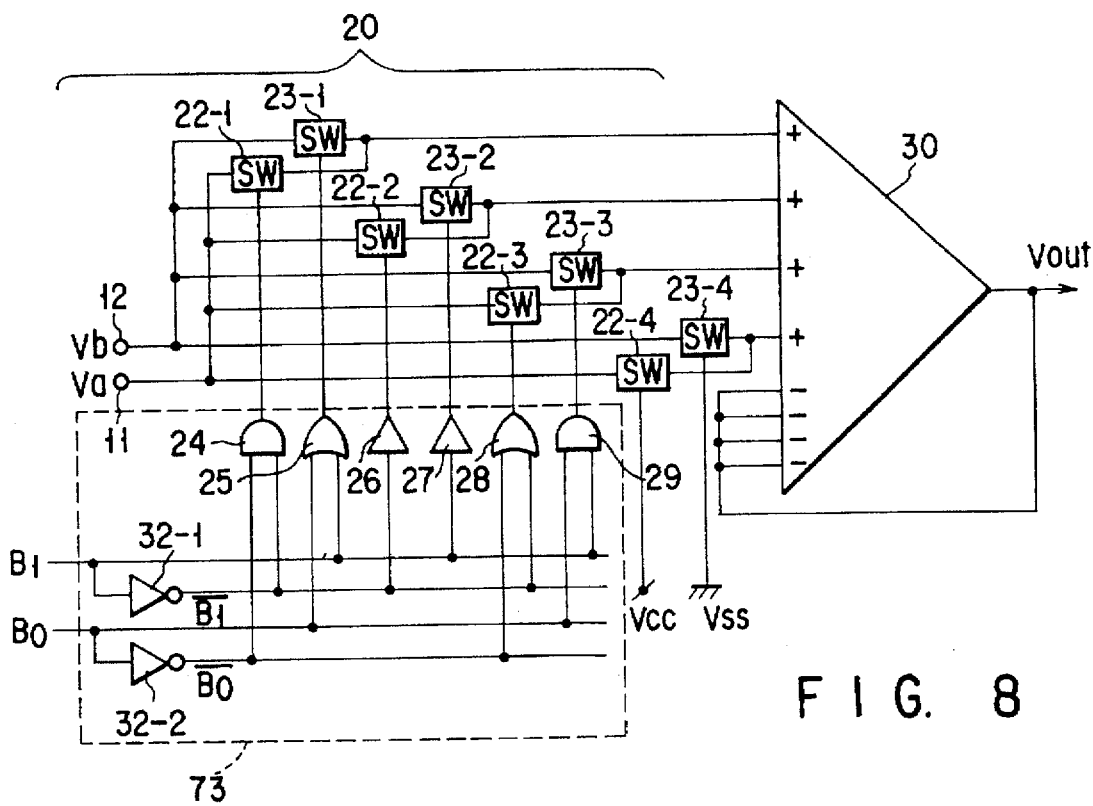
FIG. 8 is a circuit diagram showing an example of the detail construction of a connection switching control circuit in the circuit shown in FIG. 4.
Figure 9:
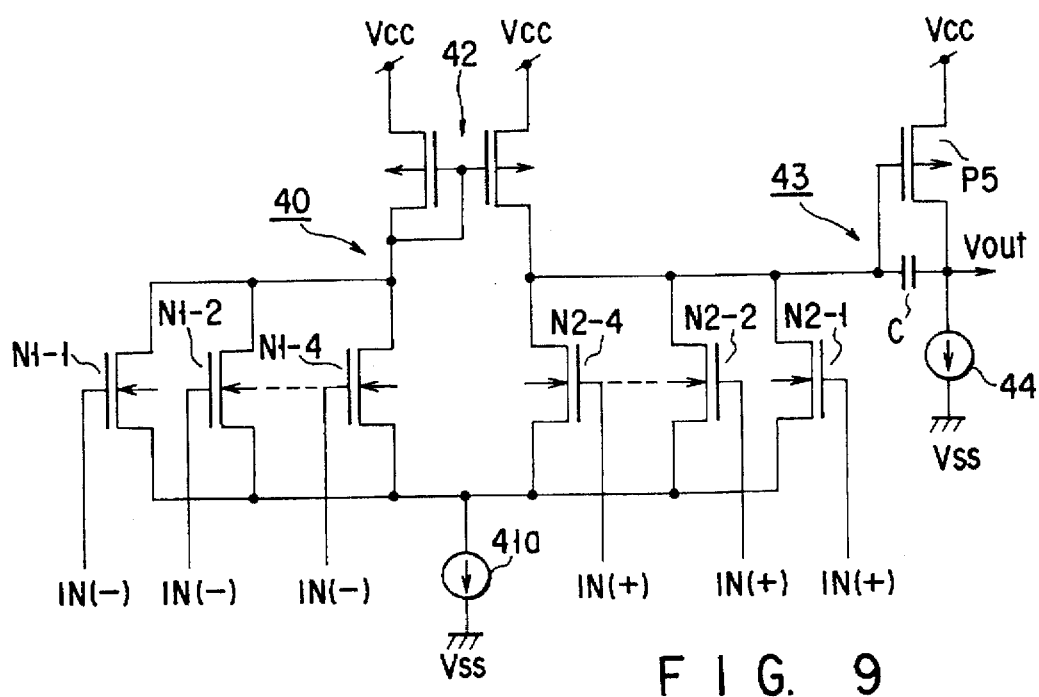
FIG. 9 is a circuit diagram showing an example of the detail construction of a multi-input operational amplifier circuit in the circuit shown in FIG. 4.
Figure 10:
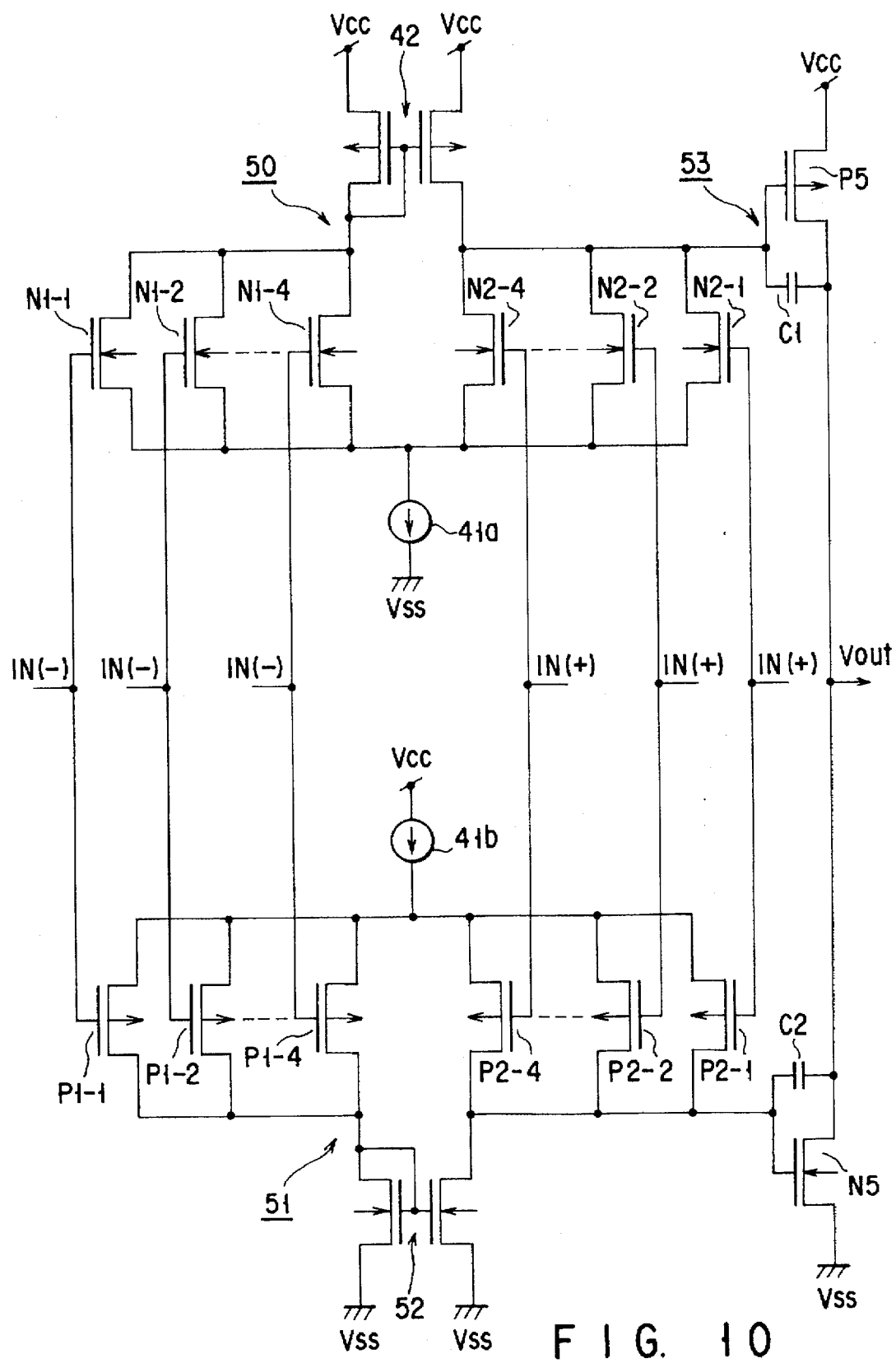
FIG. 10 is a circuit diagram showing another example of the detail construction of a multi-input operational amplifier circuit in the circuit shown in FIG. 4.
Figure 11:
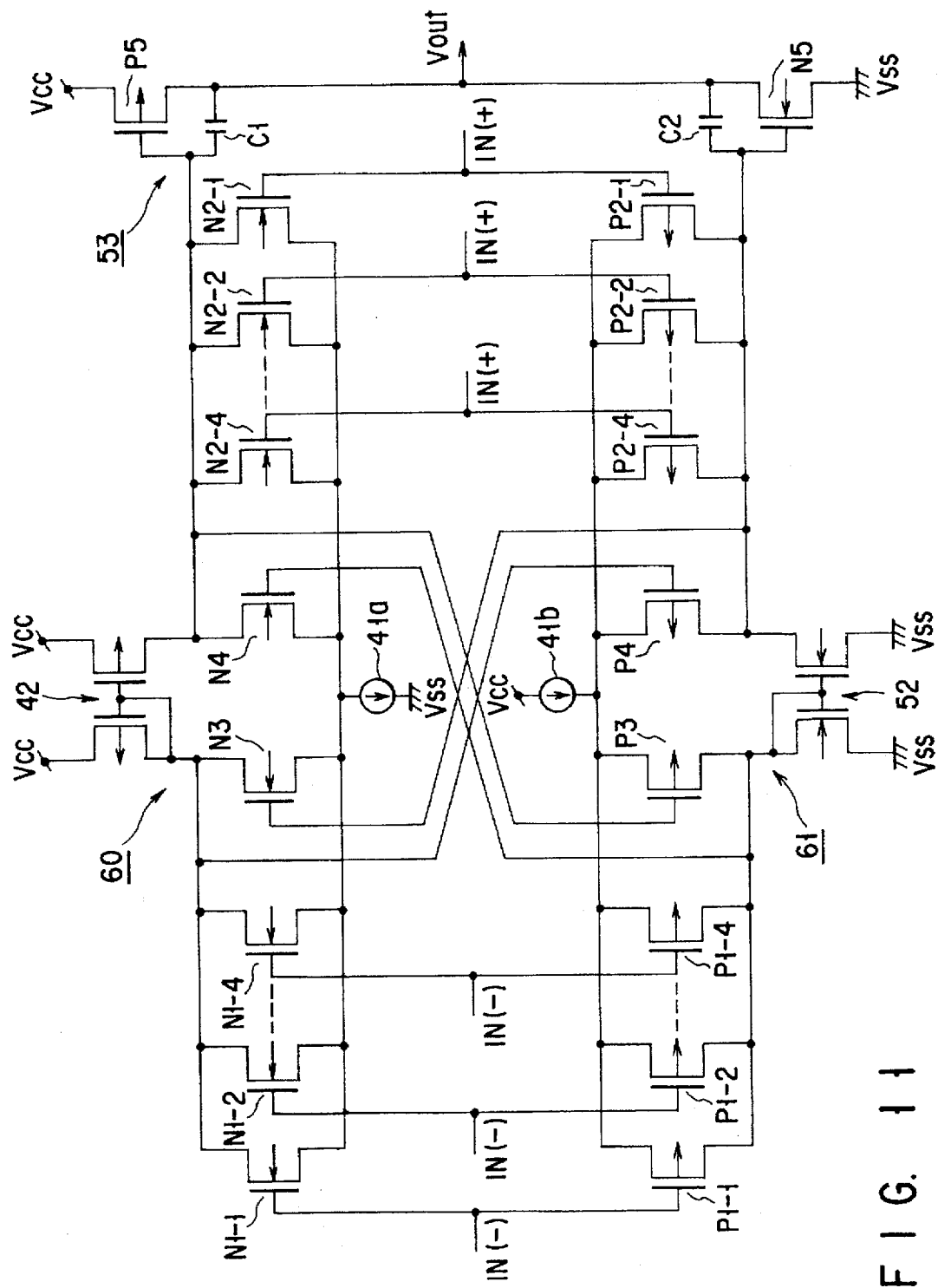
FIG. 11 is a circuit diagram showing still another example of the detail construction of a multi-input operational amplifier circuit in the circuit shown in FIG. 4.

Next, an example of the detail construction of the circuit shown in FIG. 4 is explained in detail with reference to FIGS. 7 to 11. FIGS. 7 to 11 show examples of the construction of the circuits obtained when the D/A converter shown in FIG. 4 is constructed with a 7-bit input structure (n=7). FIG. 7 shows an example of the detail construction of the D/A converter circuit section 10 which is constructed by a 5-bit (i=5) string resistor type. FIG. 8 shows an example of the construction of the 2-bit (j=2) connection switching control circuit 20. FIGS. 9 to 11 show examples of the constructions of multi-input operational amplifier circuit 30.

The string resistor type D/A converter circuit section 10 for the upper 5 bits shown in FIG. 7 includes a string resistor section 13 formed of resistors 13-1 to 13-32 with a resistance of R, switching circuits (SW) 14-1 to 14-40 connected between the respective connection nodes of the resistors 13-1 to 13-32 and signal lines 15-1 to 15-5, a first decoder circuit 71 for decoding a binary code "$B_6$ to $B_4$" of upper 3 bits of the input binary code "$B_6$ to $B_2$" of upper 5 bits to selectively control the ON/OFF state of the switching circuits 14-1 to 14-40, switching circuits 16-1 to 16-8 selectively connected between the signal lines 15-1 to 15-5 and output nodes 11, 12, and a second decoder circuit 72 for decoding a binary code "$B_3$, $B_2$" of lower 2 bits of the input binary code "$B_6$ to $B_2$" of upper 5 bits to selectively control the ON/OFF state of the switching circuits 16-1 to 16-8.

The resistors 13-1 to 13-32 are serially connected between a high-level side node to which a first reference voltage $V_{REFH}$ is applied and a low-level side node to which a second reference voltage $V_{REFL}$ is applied and voltages on the respective nodes are divided by the 32 resistors 13-1 to 13-32. The voltage $V_{REFH}$ on the high-level side node, 31 divided voltages, and the voltage $V_{REFL}$ on the low-level side node are divided into first to eighth groups by the switching circuits 14-1 to 14-40 and 16-1 to 16-8. The first voltage group includes five voltages on the high-level side node and first to fourth upper voltage dividing nodes, and the second voltage group includes five voltages on the fourth to eighth voltage dividing nodes. Likewise, the third voltage group includes five voltages on the eighth to twelfth voltage dividing nodes, and the fourth voltage group includes five voltages on the twelfth to sixteenth voltage dividing nodes. Further, the fifth voltage group includes five voltages on the sixteenth to twentieth voltage dividing nodes, and the sixth voltage group includes five voltages on the twentieth to twenty-fourth voltage dividing nodes. In addition, the seventh voltage group includes five voltages on the twenty-fourth to twenty-eighth voltage dividing nodes, and the eighth voltage group includes five voltages on the twenty-eighth to thirty-first voltage dividing nodes and the low-level side node.

The voltages of the above eight voltage groups are selected by controlling the ON/OFF states of the switching circuits 14-1 to 14-40 according to a decoding output of the decoder circuit 71 and output to the signal lines 15-1 to 15-5. The voltages output to the signal lines 15-1 to 15-5 are selectively output as the voltages Va, Vb from the first and second output nodes 11, 12 by controlling the ON/OFF states of the switching circuits 16-1 to 16-8 according to a decoding output of the decoder circuit 72. The decoder circuit 71 includes 3-input AND gates 17-1 to 17-8 and inverter circuits 18-1 to 18-3. Each of the AND gates 17-1 to 17-8 is selectively supplied with binary code bits $B_6$ to $B_4$ and signals $\overline{B_6}$ to $\overline{B_4}$ obtained by inverting the binary code bits by the inverter circuits 18-1 to 18-3. Outputs of the AND gates 17-1 to 17-8 are respectively supplied to the switching circuits 14-1 to 14-5, the switching circuits 14-6 to 14-10, the switching circuits 14-11 to 14-15, the switching circuits 14-16 to 14-20, the switching circuits 14-21 to 14-25, the switching circuits 14-26 to 14-30, the switching circuits 14-31 to 14-35, and the switching circuits 14-36 to 14-40 for the respective columns to control the ON/OFF states of the switching circuits 14-1 to 14-40 for each column. At this time, the voltage of the highest potential level among the five voltages in the selected voltage group is input to the analog switching circuit SW1, the voltage of the second highest potential level is input to the analog switching circuits SW2, SW3, the voltage of the third highest potential level is input to the analog switching circuits SW4, SW5, the voltage of the fourth highest potential level is input to the analog switching circuits SW6, SW7, and the voltage of the lowest potential level is input to the analog switching circuit SW8. The output ends of the analog switching circuits SW3, SW5, SW7, SW8 are connected to the first node 11 for outputting of the voltage Va, and the output ends of the analog switching circuits SW1, SW2, SW4, SW6 are connected to the second node 12 for outputting of the voltage Vb.

The decoder circuit 72 includes 2-input AND gates 19-1 to 19-4 and inverter circuits 21-1, 21-2. Each of the AND gates 19-1 to 19-4 is selectively supplied with binary code bits $B_3$, $B_2$ and signals $\overline{B_3}$, $\overline{B_2}$ obtained by inverting the binary code bits by the inverter circuits 21-1, 21-2. An output of the AND gate 19-1 is supplied to the switching circuits 16-1, 16-3, and an output of the AND gate 19-2 is supplied to the switching circuits 16-2, 16-5. An output of the AND gate 19-3 is supplied to the switching circuits 16-4, 16-7, and an output of the AND gate 19-4 is supplied to the switching circuits 16-6, 16-8. Then, two adjacent voltages of the five voltages of the selected voltage group are selected by the analog switching circuits 16-1 to 16-8 and output from the first and second output nodes 11 and 12 as the voltages Va and Vb (which is higher than Va by the weight of the binary code $B_2$).

The connection switching control circuit 20 for the lower 2 bits shown in FIG. 8 includes analog switching circuits (SW) 22-1 to 22-4, analog switching circuits (SW) 23-1 to 23-4 and a decoder circuit 73. The analog switching circuits 22-1 to 22-4 are respectively connected between the first output node 11 in the circuit of FIG. 7 and the four positive input terminals (+) of the 4-input operational amplifier circuit 30. Also, the analog switching circuits 23-1 to 23-4 are respectively connected between the second output node 12 and the four positive input terminals (+). The decoder circuit 73 decodes the lower 2-bit binary code "$B_1, B_0$" and controls the ON/OFF states of the analog switching circuits 22-1 to 22-4, 23-1 to 23-4 according to the result of decoding to selectively input the voltage Va or Vb to the four positive input terminals (+) of the 4-input operational amplifier circuit 30. That is, the decoder circuit 73 includes AND gates 24, 29, OR gates 25, 28, buffer circuits 26, 28, and inverter circuits 32-1, 32-2. The inverter circuits 32-1, 32-2 are used to respectively create inversion signals $\overline{B}_1, \overline{B}_0$ of the binary code bits $B_1, B_0$. The AND gate 24 is supplied with the binary code bits $\overline{B}_1, \overline{B}_0$ to control the ON/OFF state of the switching circuit 22-1. The OR gate 25 is supplied with the binary code bits $B_1, B_0$ to control the ON/OFF state of the switching circuit 23-1. The buffer circuit 26 is supplied with the binary code bit $\overline{B}_1$ to control the ON/OFF state of the switching circuit 22-2, and the buffer circuit 27 is supplied with the binary code bit $B_1$ to control the ON/OFF state of the switching circuit 23-2. The OR gate 28 is supplied with the binary code bits $\overline{B}_1, \overline{B}_0$ to control the ON/OFF state of the switching circuit 22-3. Further, the AND gate 29 is supplied with the binary code bit $B_1, B_0$ to control the ON/OFF state of the switching circuit 23-3. The analog switching circuit 22-4 is applied with the power source voltage Vcc as a control signal so as to always select Va and the analog switching circuit 23-4 is applied with the ground potential Vss as a control signal. As a result, Vb is input to three of the four positive input terminals (+) except one positive input terminal (+) to which Va is always applied in a case where the binary code bits $B_1, B_0$ are (1, 1), for example, and Va is input to the remaining three positive input terminals (+) in a case where the binary code bits $B_1, B_0$ are (0, 0), for example.

Figure 3:
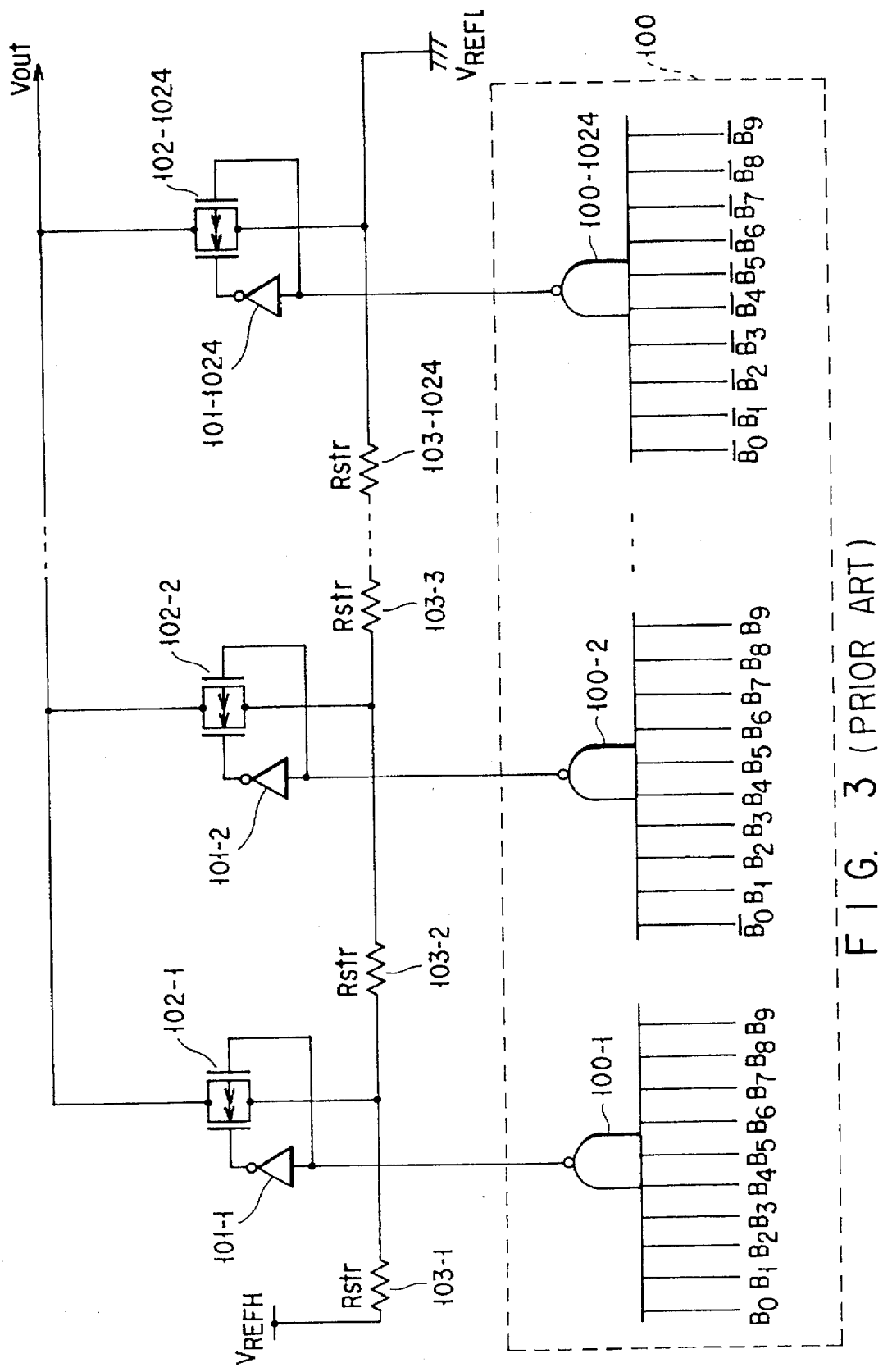
FIG. 3 is a circuit diagram showing a 10-bit string resistor type D/A converter, for explaining another conventional D/A converter.

For example, the analog switching circuits 14-1 to 14-40, 16-1 to 16-8, 22-1 to 22-4 and 23-1 to 23-4 shown in FIGS. 7 and 8 are each constructed by a CMOS transfer gate (corresponding to 101-1 to 101-1024) used in the circuit of FIG. 3 and an inverter circuit (corresponding to 101-1 to 101-1024) for creating complementary signals for controlling the CMOS transfer gate.

FIG. 9 shows an example of the construction of the multi-input operational amplifier circuit 30 in the D/A converter shown in FIG. 4 and shows an N-top type operational amplifier circuit in which input voltages are applied to the gates of N-channel MOS transistors. The N-top type operational amplifier circuit 40 includes a current mirror circuit 42 acting as a load, $2^j$ (j=2, four) N-channel MOS transistors N1-1 to N1-4, $2^j$ N-channel MOS transistors N2-1 to N2-4, a current source circuit 41a, and an output stage amplifier circuit (P-channel MOS inverter circuit) 43. The drains of the N-channel MOS transistors N1-1 to N1-4 are commonly connected to one end of the current path of one of two P-channel MOS transistors constructing the current mirror circuit 42, the sources thereof are commonly connected to the current source circuit 41a, and the gates thereof are connected to the $2^j$ negative input terminals (−) and are supplied with input voltages N(−). The drains of the N-channel MOS transistors N2-1 to N2-4 are commonly connected to one end of the current path of the other of the two P-channel MOS transistors constructing the current mirror circuit 42, the sources thereof are commonly connected to the current source circuit 41a, and the gates thereof are connected to the $2^j$ positive input terminals (+) and are supplied with input voltages N(+). The output stage amplifier circuit 43 includes a P-channel MOS transistor P5, capacitor C for phase compensation, and a current source circuit 44. The source of the P-channel MOS transistor P5 is connected to the power source Vcc, the drain thereof is connected to the output node, and the gate thereof is connected to the drains of the N-channel MOS transistors N2-1 to N2-4. The capacitor C is connected between the gate of the P-channel MOS transistor P5 and the drain thereof (output node). The current source circuit 44 is connected between the output node and the ground node Vss.

Although not shown in the drawing, the negative input terminals (−) are connected to the output node of the output stage amplifier circuit 43. An input voltage IN(+) supplied to the positive input terminal (+) is amplified and output as the analog voltage Vout from the output node of the output stage amplifier circuit 43 and the analog voltage Vout is fed back to the negative input terminal (−), that is, to the gates of the MOS transistors N1-1 to N1-4.

FIGS. 10 and 11 are show other examples of the construction of the multi-input operational amplifier circuit 30 in the D/A converter shown in FIG. 4 and each example is a Rail-to-Rail type operational amplifier circuit having a combination of an operational amplifier circuit of circuit form (P-top type) in which input voltages are input to the gates of P-channel MOS transistors and an operational amplifier circuit of circuit form (P-top type) shown in FIG. 9 in which input voltages are input to the gates of P-channel MOS transistors in order to enhance the operation precision of the multi-input operational amplifier circuit. The Rail-to-Rail type operational amplifier circuit having both of the P-channel MOS transistors and N-channel MOS transistors as the input MOS transistors can be operated in a range in which the input voltage varies from approx. Vss to approx. Vcc.

The multi-input operational amplifier circuit shown in FIG. 10 includes an N-top type operational amplifier 50, a P-top type operational amplifier 51, and an output stage amplifier circuit 53 supplied with an inverted output of the N-top type operational amplifier 50 and a non-inverted output of the P-top type operational amplifier 51. The N-top type operational amplifier 50 has substantially the same circuit construction as that obtained by removing the output stage amplifier circuit 43 from the N-top type operational amplifier 40. The P-top type operational amplifier 51 is equivalent to an operational amplifier obtained by changing the conductivity types of the MOS transistors in the N-top type operational amplifier 50, that is, by replacing the P-channel MOS transistors by N-channel MOS transistors and replacing the N-channel MOS transistors by P-channel MOS transistors. More specifically, the P-top type operational amplifier 51 includes a current source circuit 41b, P-channel MOS transistors P1-1 to P1-4, P-channel MOS transistors P2-1 to P2-4, and a current mirror circuit 52. The sources of the MOS transistors P1-1 to P1-4 are connected to the current source circuit 41b, the drains thereof are commonly connected to one end of the current path of one of the N-channel MOS transistors of the current mirror circuit 52, and the gates thereof are connected to $2^j$ (j=2, four) negative input terminals (−) and are supplied with input voltages IN(−). The sources of the MOS transistors P2-1 to P2-4 are connected to the current source circuit 41b, the drains thereof are commonly connected to one end of the current path of the other N-channel MOS transistor of the current mirror circuit 52, and the gates thereof are connected to $2^j$ positive input terminals (+) and are supplied with input voltages IN(+).

The output stage amplifier circuit 53 includes a P-channel MOS transistor P5, N-channel MOS transistor N5 and capacitors C1, C2 for phase compensation. The MOS transistor P5 has a source-drain path connected between the power source voltage Vc and the output node and a gate connected to the inverted output node of the N-top type operational amplifier circuit 50. The MOS transistor N5 has a source-drain path connected between the output node and the ground potential Vss and a gate connected to the non-inverted output node of the P-top type operational amplifier circuit 51. The capacitor C1 is connected between the output node and the gate of the MOS transistor P5, and the capacitor C2 is connected between the output node and the gate of the MOS transistor N5.

FIG. 11 shows another example of the construction of the Rail-to-Rail type operational amplifier circuit shown in FIG. 10. The multi-input operational amplifier circuit includes an N-top type operational amplifier circuit 60, P-top type operational amplifier circuit 61, and output stage amplifier circuit 53 having the same circuit construction as that shown in FIG. 10. The N-top type operational amplifier circuit 60 is constructed by connecting the current path of an N-channel MOS transistor N3 in parallel with the N-channel MOS transistors N1-1 to N1-4 shown in FIG. 10 and connecting the current path of an N-channel MOS transistor N4 in parallel with the N-channel MOS transistors N2-1 to N2-4. The P-top type operational amplifier circuit 61 is constructed by connecting the current path of a P-channel MOS transistor P3 in parallel with the P-channel MOS transistors P1-1 to P1-4 shown in FIG. 10 and connecting the current path of a P-channel MOS transistor P4 in parallel with the P-channel MOS transistors P2-1 to P2-4. The gate of the MOS transistor N3 is connected to the drains of the MOS transistors P2-1 to P2-4 and P4 and is supplied with the non-inverted output of the P-top type operational amplifier circuit 61. The gate of the MOS transistor N4 is connected to the drains of the MOS transistors Pi-1 to P1-4 and P3 and is supplied with the inverted output of the P-top type operational amplifier circuit 61. The gate of the MOS transistor P3 is connected to the drains of the MOS transistors N2-1 to N2-4 and N4 and is supplied with the non-inverted output of the N-top type operational amplifier circuit 60. The gate of the MOS transistor P4 is connected to the drains of the MOS transistors N1-1 to N1-4 and N3 and is supplied with the inverted output of the N-top type operational amplifier circuit 60.

Although not shown in the drawing, in the circuit of FIGS. 9 and 10, the negative input terminals (−) are connected to the output node of the output stage amplifier circuit 53. The input voltage IN(+) supplied to the positive input terminal (+) is amplified and output as the analog voltage Vout from the output node of the output stage amplifier circuit 53 and the analog voltage Vout is fed back to the negative input terminals (−), that is, to the gates of the MOS transistors N1-1 to N1-4, P1-1 to P1-4.

In the Rail-to-Rail type operational amplifier circuit with the construction shown in FIG. 11, if the level of the input signal voltage is set in the range of "Vss" to "Vss+Vthn" (Vthn is a threshold voltage of the N-channel MOS transistor) (which is not in the operation range of the N-top type operational amplifier circuit 60 but in the operation range of the P-top type operational amplifier circuit 61), the N-channel MOS transistors N1-1 to N1-4, N2-1 to N2-4 of the N-top type operational amplifier circuit 60 are turned OFF. On the other hand, the P-top type operational amplifier circuit 61 is operated since the level of the input signal voltage is set in the operation range thereof, and the non-inverted output and the inverted output of the P-top type operational amplifier circuit 61 are supplied to the gates of the N-channel MOS transistors N3, N4 of the N-top type operational amplifier circuit 60 so that the N-top type operational amplifier circuit 60 will also be operated. Therefore, the voltage of the non-inverted output node of the N-top type operational amplifier circuit 60 can be stably (fixedly) determined. As a result, since the operating point of the output stage amplifier circuit 53 is stably determined and the current thereof is fixedly determined, the magnitude of the output current can be adequately set.

On the other hand, if the level of the input signal voltage is set in the range of "Vcc" to "Vcc−|Vthp|" (Vthp is a threshold voltage of the P-channel MOS transistor) (which is not in the operation range of the P-top type operational amplifier circuit 61 but in the operation range of the N-top type operational amplifier circuit 60), the P-channel MOS transistors P1-1 to P1-4, P2-1 to P2-4 of the P-top type operational amplifier circuit 61 are turned OFF. On the other hand, the N-top type operational amplifier circuit 60 is operated since the level of the input signal voltage is set in the operation range thereof, and the non-inverted output and the inverted output of the N-top type operational amplifier circuit 60 are supplied to the gates of the P-channel MOS transistors P3, P4 of the P-top type operational amplifier 61 so that the P-top type operational amplifier circuit 61 will also be operated. Therefore, the voltage of the non-inverted output node of the N-top type operational amplifier circuit 60 can be stably (fixedly) determined. As a result, since the operating point of the output stage amplifier circuit 53 is stably determined and the current thereof is fixedly determined, the magnitude of the output current can be adequately set. Further, if the level of the input signal voltage is set in the range of "Vss+Vthn" to "Vcc−|Vthp|" (which is in the operation range of the N-top type operational amplifier circuit 60 and in the operation range of the P-top type operational amplifier circuit 61), the N-top type operational amplifier circuit 60 and the P-top type operational amplifier circuit 61 are operated in response to the input signal voltage. In this case, the N-channel MOS transistors N3, N4 of the N-top type operational amplifier 60 are operated to determine the voltage on the non-inverted output node of the N-top type operational amplifier 60 and the P-channel MOS transistors P3, P4 of the P-top type operational amplifier 61 are operated to determine the voltage on the inverted output node of the P-top type operational amplifier 61.

In the circuit shown in FIGS. 9 to 11, the influence by a difference in the threshold voltages of the input MOS transistors of the multi-input operational amplifier circuit 30 can be reduced by variously and adequately modifying the method of applying the voltage Va or Vb from the connection switching control circuit 20 for the lower j bits to the $2^j$ positive input terminals (+).

Further, in the circuit shown in FIGS. 9 to 11, a case wherein j=2, that is, the 4-input operational amplifier circuit is used is explained, but in the circuit shown in FIG. 9, a j-input operational amplifier circuit can be realized by connecting N-channel MOS transistors N1, N2 of a number corresponding to the number of necessary inputs in parallel, for example, connecting j N-channel MOS transistors N1, N2 in parallel. Likewise, in the circuit shown in FIGS. 10 and 11, a j-input operational amplifier circuit can be realized by connecting N-channel MOS transistors N1, N2 and P-channel MOS transistors P1, P2 of a number corresponding to the number of necessary inputs in parallel, for example, connecting j N-channel MOS transistors N1, N2 and j P-channel MOS transistors P1, P2 in parallel.

Figures 12A, 12B:
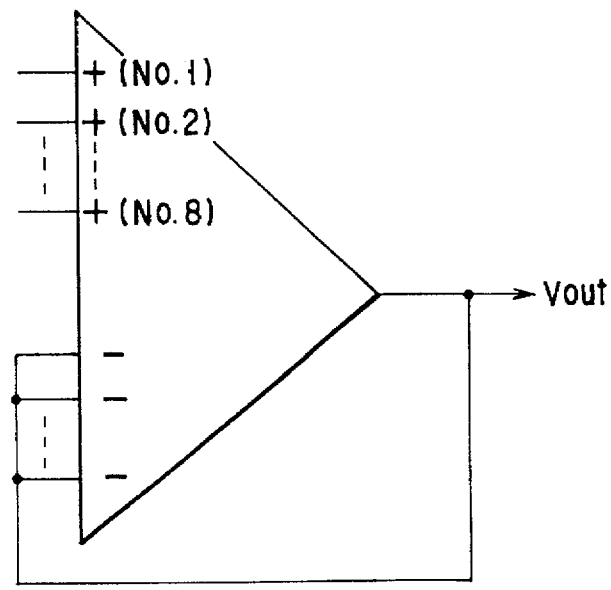
FIG. 12A is a diagram showing the relation between the first and second voltages supplied to the positive input terminals of an 8-input operational amplifier circuit according to a binary code input to the connection switching control circuit in the circuit shown in FIG. 4.
FIG. 12B is a circuit diagram showing an 8-input operational amplifier circuit to which the voltages shown in FIG. 12A are input.

FIG. 12A shows the relation between voltages Va and Vb selectively supplied to the eight positive input terminals (terminals of No. 1 to No. 8 in FIG. 12A) of an 8-input operational amplifier circuit 30 when a 3-bit binary code is input to the connection switching control circuit 20 in the circuit shown in FIG. 4. Specifically, a the positive input terminals (+) to which the voltage Va is applied and the positive input terminals (+) to which the voltage Vb is applied are separated into two groups, that is, the same voltage Va or Vb is applied to the adjacent positive input terminals (+) in the same group. More specifically, the connection switching control circuit 20 is so constructed as to supply the same voltage Va to the adjacent positive input terminals (+) if a plurality of positive input terminals (+) to which the voltage Va is to be applied are present and supply the same voltage Vb to the adjacent positive input terminals (+) if a plurality of positive input terminals (+) to which the voltage Vb is to be applied are present.

In the first embodiment, as the voltage difference between the first output node 11 and the second output node 12 of the D/A converter circuit section, a value corresponding to the weight of the least significant bit of the i-bit input is used. However, this invention is not limited to the above first embodiment, and it is possible to modify the connection switching control circuit 20 and the multi-input operational amplifier circuit 30 so as to create a value corresponding to the weight of a bit higher than the least significant bit of the i-bit input as the above voltage difference and output a D/A converted voltage of a value obtained by dividing the above voltage difference according to a binary code of j bits in the n-bit input.

Figure 13:
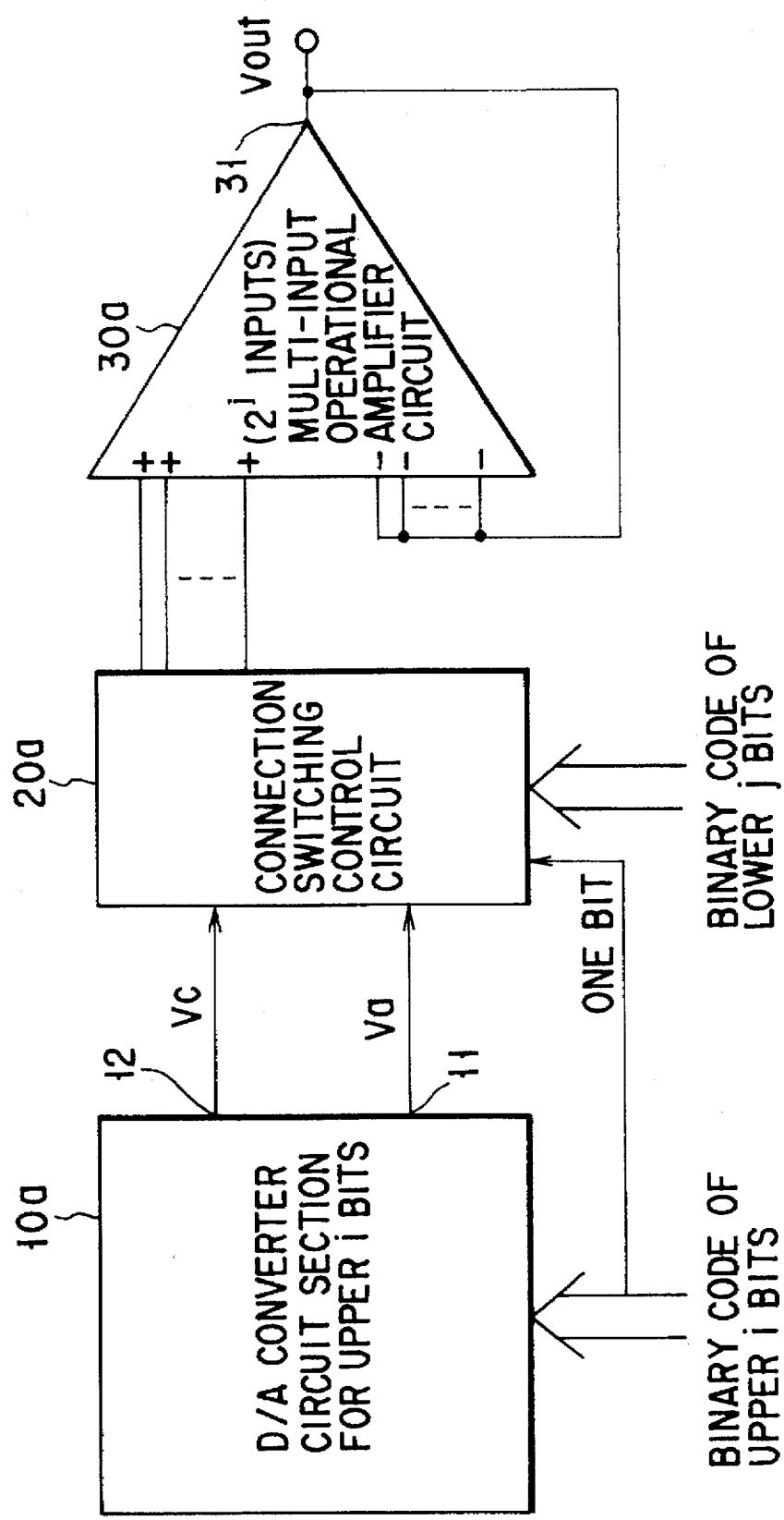
FIG. 13 is a block diagram showing the schematic construction of a D/A converter according to a second embodiment of this invention.

For example, as the voltage difference between the first output node 11 and the second output node 12 of the D/A converter circuit section, a value corresponding to the weight of the second least significant bit which is one-bit higher than the least significant bit of the i-bit input is output, the connection switching control circuit and the multi-input operational amplifier circuit may be modified as shown in FIG. 13. That is, a connection switching control circuit 20a is constructed to decode a (j+1)-bit binary code of the j bits and the least significant bit of the i-bit input. In this case, a voltage Va of the second output node 12 of the D/A converter circuit section 10a is selected and output to part of the $2^{(j+1)}$ output nodes corresponding to the result of decoding, and a voltage Vc (=2Vb) of the first output node 11 of the D/A converter circuit section 10a is selected and output to the remaining output nodes. Further, the multi-input operational amplifier circuit 30a is constructed to have $2^{(j+1)}$ positive input terminals (+) and $2^{(j+1)}$ negative input terminals (−) corresponding to the output nodes of the connection switching control circuit 20a, voltages of the $2^{(j+1)}$ output nodes of the connection switching control circuit 20a are respectively input to the $2^{(j+1)}$ positive input terminals and the $2^{(j+1)}$ negative input terminals (−) are commonly connected to the output terminal 31.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A digital-to-analog converter comprising:

a D/A converter circuit section for receiving a partial binary code of upper bits of a digital input, outputting a first voltage obtained by subjecting the partial binary code of upper bits to the D/A conversion from a first output node, and outputting a second voltage which is higher than the D/A conversion voltage from a second output node;

a connection switching control circuit for receiving the first and second voltages output from said D/A converter circuit section and a partial binary code containing lower bits of the digital input, decoding the partial binary code containing lower bits, selectively outputting the first voltage supplied from said D/A converter circuit section to part of a plurality of output nodes according to the result of decoding and selectively outputting the second voltage supplied from said D/A converter circuit section to the remaining part of the plurality of output nodes; and a multi-input operational amplifier circuit having a plurality of positive input terminals corresponding to the plurality of output nodes of said connection switching control circuit, negative input terminals of the same number as the plurality of positive input terminals, and an output terminal for outputting an analog voltage corresponding to the digital input, the plurality of positive input terminals being supplied with output voltages from the plurality of output nodes of said connection switching control circuit and the negative input terminals being commonly connected to the output terminal.

2. A digital-to-analog converter according to claim 1, wherein said D/A converter circuit section includes a string resistor type D/A converter circuit.

3. A digital-to-analog converter according to claim 1, wherein said multi-input operational amplifier circuit includes one of a P-top type operational amplifier circuit, an N-top type operational amplifier circuit and a Rail-to-Rail type multi-input operational amplifier circuit having a combination of an P-top type operational amplifier circuit and an N-top type operational amplifier circuit.

4. A digital-to-analog converter comprising:

a D/A converter circuit section for receiving a binary code of upper i bits of an n-bit (i<n) digital input, subjecting the binary code of upper i bits to the D/A conversion, outputting a D/A conversion voltage determined by the i-bit binary code from a first output node, and outputting a voltage which is higher than the D/A conversion voltage by an amount corresponding to the weight of the least significant bit of the i-bit binary code from a second output node;

a connection switching control circuit for receiving the voltages from the first and second output nodes of said D/A converter circuit section and a binary code of the remaining lower j (j<n, j=n−i) bits of the n-bit digital input, decoding the binary code of lower j bits, selectively outputting the voltage from the first output node of said D/A converter circuit section to part of $2^j$ output nodes according to the result of decoding and selectively outputting the voltage from the second output node of said D/A converter circuit section to the remaining part of the $2^j$ output nodes; and a multi-input operational amplifier circuit having $2^j$ positive input terminals corresponding to the $2^j$ output nodes of said connection switching control circuit, $2^j$ negative input terminals, and an output terminal for outputting an analog voltage corresponding to the n-bit digital input, the $2^j$ positive input terminals being supplied with output voltages from the $2^j$ output nodes of said connection switching control circuit and the $2^j$ negative input terminals being commonly connected to the output terminal.

5. A digital-to-analog converter according to claim 4, wherein said D/A converter circuit section includes a string resistor type D/A converter circuit.

6. A digital-to-analog converter according to claim 4, wherein said D/A converter circuit section includes a string resistor having $2^i$ resistors serially connected between a high-level side node to which a first reference voltage is applied and a low-level side node to which a second reference voltage is applied, a first switching circuit group for selecting the first reference voltage of the high-level side node, $(2^i-1)$ divided voltages on the string resistor, and the second reference voltage of the low-level side node, a first decoder circuit for decoding the upper-side binary code of the i-bit binary code and selectively controlling the ON/OFF state of said first switching circuit group, a second switching group for selecting voltages for each group and supplying the voltages to the first and second nodes, a second decoder circuit for decoding the lower-side binary code of the i-bit binary code and selectively controlling the ON/OFF state of said second switching circuit group.

7. A digital-to-analog converter according to claim 4, wherein said connection switching control circuit includes a third switching circuit group for selectively supplying voltages of the first and second nodes to the positive input terminals of said multi-input operational amplifier circuit, and a third decoder circuit for receiving the binary code of lower j bits and controlling the ON/OFF state of said third switching circuit group.

8. A digital-to-analog converter according to claim 4, wherein said multi-input operational amplifier includes one of a P-top type operational amplifier circuit, an N-top type operational amplifier circuit and a Rail-to-Rail type multi-input operational amplifier circuit having a combination of an P-top type operational amplifier circuit and an N-top type operational amplifier circuit.

9. A digital-to-analog converter according to claim 4, wherein said multi-input operational amplifier circuit includes a first transistor group of $2^j$ transistors whose current paths are connected in parallel and whose gates are connected to the $2^j$ positive input terminals, a second transistor group of $2^j$ transistors whose gates are connected to the $2^j$ negative input terminals, a current mirror circuit for supplying currents from a first potential supplying source to a connection node of one-side ends of the current paths of said first transistor group and a connection node of one-side ends of the current paths of said second transistor group, a first current source circuit connected between a second potential supplying source and connection nodes of the other ends of the current paths of said first and second transistor groups, and an output stage amplifier circuit having an input terminal connected to a connection node of said second transistor group and said current mirror circuit, for outputting an analog voltage from an output node.

10. A digital-to-analog converter according to claim 9, wherein said output stage amplifier circuit includes a transistor whose current path is connected at one end to the first potential supplying source and connected at the other end to the output node and whose gate is connected to the connection node of said second transistor group and said current mirror circuit, a capacitor for phase compensation connected between the gate of said transistor and the output node, and a second current source circuit connected between the output node and the second potential supplying source.

11. A digital-to-analog converter according to claim 4, wherein said multi-input operational amplifier circuit includes a first transistor group of $2^j$ transistors of first conductivity type whose current paths are connected in parallel and whose gates are connected to the $2^j$ positive input terminals, a second transistor group of $2^j$ transistors of the first conductivity type whose gates are connected to the $2^j$ negative input terminals, a first current mirror circuit for supplying currents from a first potential supplying source to a connection node of one-side ends of the current paths of said first transistor group and a connection node of one-side ends of the current paths of said second transistor group, a first current source circuit connected between a second potential supplying source and connection nodes of the other ends of the current paths of said first and second transistor groups, a third transistor group of $2^j$ transistors of second conductivity type whose current paths are connected in parallel and whose gates are connected to the $2^j$ positive input terminals, a fourth transistor group of $2^j$ transistors of the second conductivity type whose gates are connected to the $2^j$ negative input terminals, a second current source circuit connected between the first potential supplying source and connection nodes of the one-side ends of the current paths of said third and fourth transistor groups, a second current mirror circuit connected between the second potential supplying source and the connection node of one-side ends of the current paths of said third transistor group and the connection node of one-side ends of the current paths of said fourth transistor group, and an output stage amplifier circuit having an input terminal connected to a connection node of said second transistor group and said first current mirror circuit and a connection node of said fourth transistor group and said second current mirror circuit, for outputting an analog voltage.

12. A digital-to-analog converter according to claim 11, wherein said output stage amplifier circuit includes a first transistor of the second conductivity type whose current path is connected at one end to the first potential supplying source and connected at the other end to the output node and whose gate is connected to the connection node of said second transistor group and said first current mirror circuit, a first capacitor for phase compensation connected between the gate of said first transistor and the output node, a second transistor of the first conductivity type whose current path is connected at one end to the second potential supplying source and connected at the other end to the output node and whose gate is connected to the connection node of said fourth transistor group and said second current mirror circuit, and a second capacitor for phase compensation connected between the gate of said second transistor and the output node.

13. A digital-to-analog converter according to claim 11, further comprising a first MOS transistor of the first conductivity type whose current path is connected in parallel with said first transistor group and whose gate is connected to the connection node of said fourth transistor group and said second current mirror circuit, a second MOS transistor of the first conductivity type whose current path is connected in parallel with said second transistor group and whose gate is connected to the connection node of said third transistor group and said second current mirror circuit, a third MOS transistor of the second conductivity type whose current path is connected in parallel with said third transistor group and whose gate is connected to the connection node of said second transistor group and said first current mirror circuit, and a fourth MOS transistor of the second conductivity type whose current path is connected in parallel with said fourth transistor group and whose gate is connected to the connection node of said first transistor group and said first current mirror circuit.

14. A digital-to-analog converter comprising:

a D/A converter circuit section for receiving a binary code of upper i bits of an n-bit (i<n) digital input, subjecting the binary code of upper i bits to the D/A conversion, outputting a D/A conversion voltage determined by the i-bit binary code from a first output node, and outputting a voltage which is higher than the D/A conversion voltage by an amount corresponding to the weight of the second least significant bit which is higher by one bit than the least significant bit of the i-bit binary code from a second output node;

a connection switching control circuit for receiving the voltages from the first and second output nodes of said D/A converter circuit section, a binary code of the remaining lower j (j<n, j=n−i) bits of the n-bit digital input, and a binary code of the least significant bit of the i bits, decoding the (j+1)-bit binary code, selectively outputting the voltage from the first output node of said D/A converter circuit section to part of $2^{(j+1)}$ output nodes according to the result of decoding and selectively outputting the voltage from the second output node of said D/A converter circuit section to the remaining part of the $2^{(j+1)}$ output nodes; and a multi-input operational amplifier circuit having $2^{(j+1)}$ positive input terminals corresponding to the $2^{(j+1)}$ output nodes of said connection switching control circuit, $2^{(j+1)}$ negative input terminals, and an output terminal for outputting an analog voltage corresponding to the n-bit digital input, the $2^{(j+1)}$ positive input terminals being supplied with output voltages from the $2^{(j+1)}$ output nodes of said connection switching control circuit and the $2^{(j+1)}$ negative input terminals being commonly connected to the output terminal.

15. A digital-to-analog converter according to claim 14, wherein said D/A converter circuit section includes a string resistor type D/A converter circuit.

16. A digital-to-analog converter according to claim 14, wherein said multi-input operational amplifier circuit includes one of a P-top type operational amplifier circuit, an N-top type operational amplifier circuit and a Rail-to-Rail type multi-input operational amplifier circuit having a combination of an P-top type operational amplifier circuit and an N-top type operational amplifier circuit.

17. A digital-to-analog converter comprising:

D/A converter means for receiving a binary code of upper i bits of an n-bit (i<n) digital input, subjecting the binary code of upper i bits to the D/A conversion, outputting a D/A conversion voltage determined by the i-bit binary code from a first output node, and outputting a voltage which is higher than the D/A conversion voltage by an amount corresponding to the weight of the least significant bit of the i-bit binary code from a second output node;

connection switching control means for receiving the voltages from the first and second output nodes of said D/A converter means and a binary code of the remaining lower j (j<n, j=n−i) bits of the n-bit digital input, decoding the binary code of lower j bits, selectively outputting the voltage from the first output node of said D/A converter means to part of $2^j$ output nodes according to the result of decoding and selectively outputting the voltage from the second output node of said D/A converter means to the remaining part of the $2^j$ output nodes; and multi-input operational amplifier means having $2^j$ positive input terminals corresponding to the $2^j$ output nodes of said connection switching control means, $2^j$ negative input terminals, and an output terminal for outputting an analog voltage corresponding to the n-bit digital input, the $2^j$ positive input terminals being supplied with output voltages from the $2^j$ output nodes of said connection switching control means and the $2^j$ negative input terminals being commonly connected to the output terminal.

18. A digital-to-analog converter according to claim 17, wherein said D/A converter means includes a string resistor type D/A converter circuit.

19. A digital-to-analog converter according to claim 17, wherein said connection switching control means includes a third switching circuit group for selectively supplying voltages of the first and second nodes to the positive input terminals of said multi-input operational amplifier means, and a third decoder circuit.

20. A digital-to-analog converter according to claim 17, wherein said multi-input operational amplifier means includes one of a P-top type operational amplifier circuit, an N-top type operational amplifier circuit and a Rail-to-Rail type multi-input operational amplifier circuit having a combination of an P-top type operational amplifier circuit and an N-top type operational amplifier circuit.

* * * * *

UNITED STATES PATENT AND TRADEMARK OFFICE
CERTIFICATE OF CORRECTION

PATENT NO. : 5,731,774
DATED : March 24, 1998
INVENTOR(S) : Kazuhito FUJII et al.

It is certified that error appears in the above-indentified patent and that said Letters Patent is hereby corrected as shown below:

Claim 3, Col. 16, line 48, "an P-top" should read --a P-top--.

Claim 8, Col. 17, line 42, after "amplifier", insert --circuit--.

Claim 8, Col. 17, line 46, "an P-top" should read --a P-top--.

Claim 16, Col. 20, line 1, "an P-top" should read --a P-top--.

Claim 20, Col. 20, line 49, "an P-top" should read --a P-top--.

Signed and Sealed this

Twenty-second Day of June, 1999

Attest:

Q. TODD DICKINSON

*Attesting Officer*      *Acting Commissioner of Patents and Trademarks*